United States Patent
Yi et al.

(10) Patent No.: US 8,067,301 B2
(45) Date of Patent: Nov. 29, 2011

(54) IMAGE SENSOR AND METHOD FOR FORMING THE SAME

(75) Inventors: Duk-Min Yi, Yongin-si (KR); Sung-Keun Won, Suwon-si (KR); Jun-Yeoul You, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 195 days.

(21) Appl. No.: 12/692,133

(22) Filed: Jan. 22, 2010

(65) Prior Publication Data

US 2010/0120190 A1 May 13, 2010

Related U.S. Application Data

(62) Division of application No. 11/217,962, filed on Sep. 1, 2005, now abandoned.

(30) Foreign Application Priority Data

Sep. 16, 2004 (KR) .................. 10-2004-0074264

(51) Int. Cl.
*H01L 21/00* (2006.01)
(52) U.S. Cl. .......... 438/506; 438/29; 438/237; 438/373; 438/369; 257/292; 257/E25.032
(58) Field of Classification Search ............ 438/29, 438/237, 373, 369, 506; 257/E25.032, 292
See application file for complete search history.

(56) References Cited

U.S. PATENT DOCUMENTS

| 5,903,021 A | 5/1999 | Lee et al. |
| 6,127,697 A | 10/2000 | Guidash |
| 6,194,258 B1 | 2/2001 | Wuu |
| 6,521,924 B2 | 2/2003 | Han et al. |
| 6,570,222 B2 | 5/2003 | Nozaki et al. |
| 6,730,899 B1 | 5/2004 | Stevens et al. |
| 6,737,291 B1 | 5/2004 | Lim |
| 6,979,587 B2 | 12/2005 | Lee |
| 7,037,748 B2 | 5/2006 | Han |
| 7,126,102 B2 | 10/2006 | Inoue et al. |

(Continued)

FOREIGN PATENT DOCUMENTS

CN 1327269 A 12/2001

(Continued)

OTHER PUBLICATIONS

"Image Sensor and Method for Forming the Same " Specification, Drawings, and Prosecution History of U.S. Appl. No. 11/217,962, filed Sep. 1, 2005 by Duk-Min Yi, et al, which is stored in the United States Patent and Trademark Office (USPTO) Image File Wrapper (IFW) system.

*Primary Examiner* — Jarrett Stark
*Assistant Examiner* — Nicholas Tobergte
(74) *Attorney, Agent, or Firm* — Onello & Mello, LLP

(57) ABSTRACT

A reliable image sensor and a method for forming the same are provided. The image sensor includes a photo-detective device. At least one transistor is electrically connected to the photo-detective device for outputting charges stored in the photo-detective device. A transistor directly connected to the photo-detective device includes a gate electrode pattern and an ion-implantation interrupting pattern arranged on the gate electrode pattern. Since the ion-implantation interrupting pattern is located on an upper portion of the gate electrode pattern of the transistor in the vicinity of the photo-detective device, a threshold voltage of the gate electrode pattern of the transistor in the vicinity of the photo-detective device is adjusted to a desired value.

18 Claims, 15 Drawing Sheets

U.S. PATENT DOCUMENTS

| | | |
|---|---|---|
| 7,250,647 B2 | 7/2007 | Rhodes |
| 2001/0006238 A1 | 7/2001 | Han et al. |
| 2001/0025970 A1 | 10/2001 | Nozaki et al. |
| 2006/0057760 A1 | 3/2006 | Yi et al. |

FOREIGN PATENT DOCUMENTS

| | | |
|---|---|---|
| JP | 2001-250934 A | 9/2001 |
| KR | 2002-0003623 A | 1/2002 |
| KR | 2002-0057285 A | 7/2002 |
| KR | 10-2004-0004901 A | 1/2004 |

IMAGE SENSOR AND METHOD FOR FORMING THE SAME

RELATED APPLICATIONS

This application is a divisional of U.S. patent application Ser. No. 11/217,962, filed on Sep. 1, 2005, which claims the benefit of Korean patent application number 10-2004-0074264, filed on Sep. 16, 2004, in the Korean Intellectual Property Office, the contents of which applications are incorporated herein in their entirety by reference.

BACKGROUND OF THE INVENTION

The present invention relates to an image sensor and a method for forming the same, more particularly to a complementary metal-oxide semiconductor (CMOS) image sensor and a method for forming the same.

Recently, digital technologies, such as the digital camera, have been rapidly advanced. Main elements for determining image quality of the digital camera are an optical lens and an image sensor. The image sensor converts light input through the optical lens into an electric signal having an excellent image quality.

The image sensor includes a pixel array composed of a plurality of pixels that are two-dimensionally arranged in a matrix form. Each pixel includes photo-detective, transfer, and readout devices. According to the types of the transfer and readout devices, the image sensor is classified as a charge coupled device (hereinafter referred to as CCD) or a CMOS image sensor (hereinafter referred to as CIS). The CCD uses MOS capacitors for transfer and readout operations. Respective MOS capacitors are arranged adjacent to each other, a charge carrier due to an electric potential difference is stored in one capacitor and is transferred to an adjacent capacitor. In contrast to this, a CIS is provided with MOS (metal-oxide semiconductor) transistors of the same number as the pixels and employs a switching mode to detect outputs in an orderly manner by using the MOS transistors.

The CCD image sensor has lower noise and higher image quality than the CIS. The CIS, compared to the CCD image sensor, has a simple operational scheme and is capable of implementing various scanning types. A single processing circuit for the CIS can be integrated into a single chip so that it is possible to miniaturize products. Also, use of compatible CMOS technique provides advantages of reducing manufacturing costs, owing to low and single power, random access with image data. Accordingly, the CIS can be used in any device that displays images, e.g., digital cameras, surveillance cameras, smart phones, PDAs, notebook computers, bar code reader, HDTV resolution cameras, toys and so forth. Currently, uses and applications of the CMOS image sensor have become progressively broader.

Unlike the CCD image sensor, the CIS is proper to integrate unit pixels, peripheral analog elements, and MOS elements on a single chip thereof by applying a CMOS fabricating process thereto. As the integration degrees of MOS transistors increase, each gate electrode of MOS transistors formed at the peripheral circuit region becomes lower in height. For example, when the heights of the gate electrodes in the MOS transistor are too high, it is impossible to implant halo ions because an aspect ratio of a space defined between the gate electrodes becomes larger. Accordingly, it is preferred that gate electrode of MOS transistors of the pixel array region be shallowly formed like those of the MOS transistors of the peripheral circuit region in the CIS.

FIG. 1 is a cross-sectional view showing a pixel of a pixel array region that illustrates an impurity ion implantation for a photo diode in a manufacturing process of a CIS, relevant to the problem arising from the CIS when the gate electrode of a MOS transistor is low in height. In FIG. 1, reference numeral 11 represents a P-type substrate, reference numeral 13 represents a gate insulation layer, and reference numerals 15a and 15b represent gate electrodes. Reference numeral 17 notes an ion implantation mask, reference numeral 19 notes an N-type impurity ion implantation for forming a photo diode, and reference numeral 21 denotes an N-type impurity diffusion region of the photo diode.

Referring to FIG. 1, the N-type impurity diffusion region of the photo diode is formed at a gate electrode 15a in the vicinity thereof by a self-alignment method, as indicated by a dotted line. However, since the gate electrodes 15a and 15b are shallow, they have a high energy, for example, about 500 keV. As an injected impurity ion passes through the gate electrode 15a, an N-type impurity diffusion region 21 is foilled at a lower portion of the gate electrode 15a. As a result, it is difficult to adjust a threshold voltage of a MOS transistor having the gate electrode 15a. This does not allow a reliable image sensor to be implemented.

SUMMARY OF THE INVENTION

The present invention is directed to a reliable image sensor and a method of forming the same.

According to a first aspect, the invention is directed to an image sensor comprising a photo-detective device and at least one transistor electrically connected to the photo-detective device for outputting charges stored in the photo-detective device. The transistor connected to the photo-detective device includes a gate electrode pattern and an ion-implantation interrupting pattern arranged on the gate electrode pattern.

In one embodiment, the ion-implantation interrupting pattern covers a part of the gate electrode pattern, and one side of the ion-implantation interrupting pattern in the vicinity of the photo-detective device is vertically aligned with one side of the gate electrode pattern in the vicinity of the photo-detective device.

In one embodiment, the ion-implantation interrupting pattern includes a dielectric layer pattern and a conductive layer pattern that are sequentially stacked. The sensor can further comprise a metal interconnection electrically connected to a gate electrode pattern region that is exposed to an outer side of the ion implantation interrupting pattern. The photo-detective device is a photo diode comprising: a first impurity diffusion region formed at a semiconductor substrate of a first conductivity type, the first impurity diffusion region being of a second conductivity type; and an impurity diffusion region of the first conductivity type formed in the first impurity diffusion region of the second conductivity type. The transistor directly connected to the photo-detective device includes a second impurity diffusion region of the second conductivity type formed on the semiconductor substrate at another outer side of the gate electrode pattern opposite to the photo-detective device.

In one embodiment, the photo-detective device is a photo diode comprising: a first impurity diffusion region formed at a semiconductor substrate of a first conductivity type, the first impurity diffusion region being of a second conductive type; and an impurity diffusion region of the first conductivity type formed in the first impurity diffusion region of the second conductivity type. The at least one transistor includes a transfer transistor, a reset transistor, a sensing transistor, and an access transistor that are serially connected to the photo-detective device. Third impurity diffusion regions of the second conductivity type are disposed in the semiconductor substrate between gate electrode patterns of the respective transistors. A gate electrode pattern of the sensing transistor is electrically connected to a third impurity diffusion region of the second conductivity type between the transfer and reset transistors.

In one embodiment, the gate electrode pattern and the conductive layer pattern are made of the same material, the dielectric layer pattern has a structure in which oxide layer-nitride layer-oxide layer are sequentially stacked.

In one embodiment, the sensor further comprises a capacitor formed of the gate electrode pattern, the dielectric layer pattern, and the conductive layer pattern which are sequentially stacked over the semiconductor substrate.

In one embodiment, the ion-implantation interrupting pattern is smaller than the gate electrode pattern and partially exposes the gate electrode pattern at a portion that is not adjacent to the photo-detective device.

According to another aspect, the invention is directed to an image sensor comprising a photo diode and a transistor directly connected to the photo diode. The photo diode has a first impurity diffusion region formed on a semiconductor substrate of a first conductivity type, the first impurity diffusion region being of a second conductivity type, and an impurity diffusion region of the first conductivity type in the first impurity diffusion region of the second conductivity type. The transistor includes a stacked gate pattern in the vicinity of the first impurity diffusion region of the second conductivity type, and a second impurity diffusion region of the second conductivity type formed on the semiconductor substrate at an outer side of the gate electrode pattern opposite to the first impurity diffusion region of the second conductivity type. The stacked gate pattern includes a gate electrode pattern, a dielectric layer pattern, and a conductive layer pattern that are sequentially formed on the semiconductor substrate, interposing a gate insulation layer therebetween.

In one embodiment, the dielectric and conductive layer patterns cover a part of the gate electrode pattern, and one side of the conductive layer pattern in the vicinity of the photo diode is vertically aligned with one side of the gate electrode pattern in the vicinity of the photo diode. In one embodiment, the sensor further comprises a metal interconnection electrically connected to a gate electrode pattern region that is exposed to an outer side of the conductive layer pattern through a contact plug.

In one embodiment, the sensor further comprises a capacitor formed of the gate electrode pattern, the dielectric layer pattern, and the conductive layer pattern which are sequentially stacked on the semiconductor substrate.

According to another aspect, the invention is directed to a transfer transistor for transferring a charge stored in a photo-detective device. The transfer transistor comprises: a gate electrode pattern to which a bias voltage is applied; and a dielectric layer pattern and a conductive layer pattern stacked on the gate electrode pattern. The dielectric layer pattern and the conductive layer pattern are smaller than the gate electrode pattern, and one side of the conductive layer pattern and one side of the gate electrode pattern in the vicinity of the photo diode are vertically aligned with each other.

In one embodiment, the transfer transistor further comprises a metal interconnection electrically connected to a gate electrode pattern region that is exposed to an outer side of the conductive layer pattern through a contact plug, for applying a bias to the transfer transistor.

According to another aspect, the invention is directed to an image sensor comprising: a photo-detective device formed at a pixel array region of a semiconductor substrate; a transfer transistor connected to the photo-detective device for transferring charges stored in the photo-detective device; and a capacitor formed at a peripheral circuit region of the semiconductor substrate. A gate electrode of the transfer transistor and the capacitor each are formed of a first conductive layer pattern, a dielectric layer pattern and a second conductive layer pattern. The second conductive layer pattern of the gate electrode of the transfer transistor partially covers the first conductive layer pattern of the gate electrode of the transfer transistor, allowing one side of the first conductive layer pattern in the vicinity of the photo-detective device to be vertically aligned with one side of the second conductive layer pattern.

In one embodiment, the image sensor further comprises a metal interconnection electrically connected to the first conductive layer pattern exposed by the second conductive layer pattern of the transfer transistor through a contact plug, for applying a bias to the transfer transistor.

In one embodiment, the transfer transistor transfers the charges stored in the photo-detective device to a floating diffusion region of a semiconductor substrate located at an outer side of the transfer transistor opposite to the photo-detective device. The image sensor further comprises: a reset transistor connected to the transfer transistor and resetting the floating diffusion region; a sensing transistor sensing the charges stored in the floating diffusion region; and an access transistor selecting an output of the sensing transistor.

In one embodiment, gate electrodes of the reset transistor, the sensing transistor, and the access transistor are formed of the first conductive layer pattern of the transfer transistor.

According to another aspect, the invention is directed to a method of forming an image sensor, comprising: (i) sequentially forming a gate oxide layer, a first conductive layer, a dielectric layer, and a second conductive layer on a semiconductor substrate; (ii) patterning the second conductive layer and the dielectric layer to form an ion-implantation interrupting pattern having sides; (iii) patterning the first conductive layer to form a gate electrode pattern having sides and being larger than the ion-implantation interrupting pattern so that one side of the ion-implantation interrupting pattern and one side of the gate electrode pattern are vertically aligned with each other; (iv) forming a first impurity diffusion region at the semiconductor substrate in contact with one side of the ion-implantation interrupting pattern and the gate electrode pattern; (v) forming an impurity diffusion region of a first conductivity type in the first impurity diffusion region, the first impurity diffusion region being of a second conductivity type; and (vi) forming a second impurity diffusion region of the second conductivity type at the semiconductor substrate in contact with the other side of the gate electrode pattern.

In one embodiment, the method further comprises forming an interlayer insulation layer; and forming a metal interconnection electrically connected to an upper side of the gate electrode pattern exposed to another side of the ion-implantation interrupting pattern through the interlayer insulation layer.

In one embodiment, step (ii) comprises: (ii-1) forming a passivation layer on the second conductive layer; (ii-2) forming a first etch mask pattern on the passivation layer; (ii-3) etching the passivation layer, the second conductive layer, and the dielectric layer formed at an outer side of the first etch mask pattern until the first conductive layer is exposed; and (ii-4) removing the first etch mask pattern.

In one embodiment, step (iii) comprises: (iii-1) forming a second etch mask pattern to cover a part of an upper surface of the ion-implantation interrupting pattern and a part of the second conductive layer at another outer side of the ion implantation pattern; (iii-2) etching the second conductive layer exposed by using the second etch mask pattern and the passivation layer as etch masks; and (iii-3) removing the second etch mask pattern.

In one embodiment, step (iv) comprises: (iv-1) forming a first ion implantation mask to cover at least the gate electrode pattern; (iv-2) implanting impurity ions of the second conductivity type into the semiconductor substrate in the vicinity of one side of the gate electrode pattern using the first ion implantation mask; and (iv-3) removing the first ion implantation mask.

In one embodiment, step (v) comprises: (v-1) forming a second ion implantation mask to expose the first impurity diffusion region of the second conductivity type; (v-2) implanting impurity ions of the first conductivity type into the first impurity diffusion region of the second conductivity type using the second ion implantation mask; (v-3) removing the second ion implantation mask.

In one embodiment, step (vi) comprises: (vi-1) forming a third ion implantation mask to cover at least the first impurity diffusion region of the second conductivity type and the impurity diffusion region of the first conductivity type; (vi-2) implanting impurity ions of the second conductivity type into the semiconductor substrate in the vicinity of another side of the gate electrode pattern using the third ion implantation mask; and (vi-3) removing the third ion implantation mask.

In one embodiment, an upper electrode pattern and a dielectric pattern are formed spaced from the ion-implantation interrupting pattern by a predetermined distance when an ion-implantation interrupting pattern having sides is formed by patterning the second conductive layer and the dielectric layer, and a lower aligned electrode pattern is formed under the upper electrode pattern and the dielectric pattern when a gate electrode pattern having sides are formed by patterning the first conductive layer. In one embodiment, a plurality of gate electrode patterns are formed spaced from the gate electrode pattern and the lower electrode pattern by a predetermined distance when a gate electrode pattern is formed by patterning the first conductive layer, and a third impurity diffusion region of the second conductivity type are formed at the semiconductor substrate between the plurality of gate electrode patterns during the formation of the second impurity diffusion region of the second conductivity type.

In one embodiment, the first impurity diffusion region of the second conductivity type is formed deeper than the second impurity diffusion region of the second conductivity type.

According to another aspect, the invention is directed to a method for forming an image sensor, comprising: (a) sequentially forming a gate oxide layer, a first conductive layer, a dielectric layer, and a second conductive layer on a semiconductor substrate having defined pixel array and peripheral circuit regions; (b) patterning the second conductive layer and the dielectric layer to form a second conductive layer pattern having sides and an ion-implantation interrupting pattern formed by a dielectric layer pattern at the pixel array region, and to form an upper electrode pattern and a dielectric pattern on the peripheral circuit region; (c) patterning the first conductive layer to form a gate electrode pattern at the pixel array region and to form a lower electrode pattern larger than the second conductive layer pattern at the peripheral circuit region so that one side of the second conductive pattern and one side of the gate electrode pattern are vertically aligned with each other; (d) forming a first impurity diffusion region at the semiconductor substrate in contact with sides of the ion-implantation interrupting pattern and the gate electrode pattern; (e) forming an impurity diffusion region of a first conductivity type in the first impurity diffusion region, the first impurity diffusion region being of a second conductivity type; and (f) forming a second impurity diffusion region of the second conductivity type at the semiconductor substrate in contact with another side of the gate electrode pattern.

In one embodiment, a plurality of first gate electrode patterns and a plurality of second gate electrode patterns are further formed at the pixel array region and the peripheral circuit region, respectively, when a gate electrode pattern having sides is formed at the pixel array region, and a lower electrode pattern is formed at the peripheral circuit region by patterning the first conductive layer.

In one embodiment, the method further comprises foaming an interlayer insulation layer; and forming a metal interconnection electrically connected to an upper surface of the gate electrode pattern exposed to another side of the ion-implantation interrupting pattern through the interlayer insulation layer.

In one embodiment, step (b) comprises: (b-1) forming a passivation layer on the second conductive layer; (b-2) forming a first etch mask pattern on the passivation layer; (b-3) etching the passivation layer, the second conductive layer, and the dielectric layer foamed at an outer side of the first etch mask pattern until the first conductive layer is exposed; and (b-4) removing the first etch mask pattern.

In one embodiment, step (c) comprises: (c-1) forming a second etch mask which covers a part of the upper electrode pattern and a part of a first conductive layer formed at an outer side of the upper electrode pattern, covers a second conductive layer formed at another outer side of the ion-implantation interrupting pattern, and exposes a part of an upper surface of the ion-implantation interrupting pattern; and (c-2) etching a first conductive layer exposed using the second etch mask pattern, the ion-implantation interrupting pattern, and the passivation layer as etch masks.

In one embodiment, step (d) comprises: (d-1) forming a first ion implantation mask to expose a semiconductor substrate in the vicinity of one side of the gate electrode pattern; (d-2) implanting impurity ions of the second conductive type into the semiconductor substrate in the vicinity of the one side of the gate electrode pattern by using the first ion implantation mask; and (d-3) removing the first ion implantation mask.

In one embodiment, step (e) comprises: (e-1) forming a second ion implantation mask to expose the first impurity diffusion region of the second conductivity type; (e-2) implanting impurity ions of the first conductivity type into the first impurity diffusion region of the second conductivity type using the second ion implantation mask; and (e-3) removing the second ion implantation mask.

In one embodiment, step (f) comprises: (f-1) forming a second ion implantation mask to cover the first impurity diffusion region of the second conductivity type and the impurity diffusion region of the first conductivity type; (f-2) implanting impurity ions of the second conductivity type into the semiconductor substrate in the vicinity of another side of the gate electrode pattern and a semiconductor substrate between the plurality of first and second gate electrode patterns by using the second ion implantation mask, the gate electrode pattern, and the plurality of first and second gate electrode patterns as ion implantation masks; and (f-3) removing the second ion implantation mask.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF PREFERRED EMBODIMENTS

In the embodiments of the present invention, although terms "first", "second" and "third" are used to describe various regions and layers, the regions and layers are not limited thereto by such terms. Further, the terms are used only to distinguish regions or layers from other regions or layers. A layer material referred to as a first layer material in one embodiment can be referred to as a second layer material in another embodiment.

In the specification, it will also be understood that when a layer is referred to as being on another layer or substrate, it can be directly on the other layer or substrate, or intervening layers may also be present.

In the specification, one side relevant to a stacked gate pattern, a gate electrode pattern, a conductive layer pattern, or an ion-implantation interrupting pattern indicates one side of a stacked gate pattern, a gate electrode pattern, a conductive layer pattern, or an ion implantation interrupting pattern, in the vicinity of a photo-detective device, respectively. The other side for the stacked gate pattern, the gate electrode pattern, the conductive layer pattern, or the ion-implantation interrupting pattern indicates the other side for the stacked gate pattern, the gate electrode pattern, the conductive layer pattern, or the ion implantation interrupting pattern, opposite to the photo-detective device. That is, when the stacked gate pattern, the gate electrode pattern, the conductive layer pattern, or the ion-implantation interrupting pattern has two sides, one side is in the vicinity of the photo-detective device and the other side is opposite to the photo-detective device.

The present invention relates to an image sensor such a CCD image sensor and a CIS, more particularly to a CIS and a method for forming the same. Particularly, the method for forming the CIS according to the present invention is applicable to a single chip CIS in that an analog element and a MOS element such as a unit pixel and peripheral circuit regions are simultaneously formed at one chip.

Hereinafter, an exemplary embodiment of the present invention will be described in conjunction with the accompanying drawings.

A CIS pixel structure includes a photo-detective device and transistors for transferring and outputting a charge stored in the photo-detective device. According to the number of transistors used, the CIS pixel structure may have various forms. For example, the CIS pixel may include one, two, three, four, or five transistors.

Figure 2:
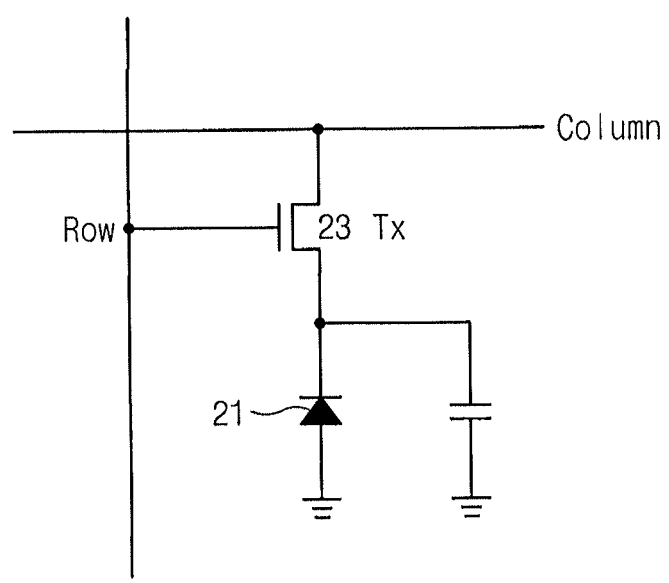
FIG. 2 is an equivalent circuit diagram of a CIS pixel structure having a photo-detective device and one transistor.

FIG. 2 is an equivalent circuit diagram of a CIS pixel structure (hereinafter, referred to as single-transistor CIS pixel structure) having a photo-detective device and one transistor. Since one pixel is composed of a photo-detective device 21 and one transfer transistor 23, the single-transistor CIS pixel structure of the same pixel size has a light receiving section area greater than that of a pixel structure having 2 to 4 transistors. The single-transistor CIS pixel structure can obtain a fill factor of 70 through 80%. However, when a signal is output, a significantly great noise occurs. Further, since a sense amplifier for signal amplification and a capacitor for signal storage are located at an end of a bus line, they are influenced by a parasitic capacitance, causing the occurrence of a great fixed pattern noise.

In the operation of the single-transistor CIS pixel structure, as light is incident to a light receiving section 21, it produces an Electron-Hole Pair (EHP). The EHP signal charge is transferred to an output terminal according to a gate electrode bias of a MOS transistor 23.

Figure 3A:
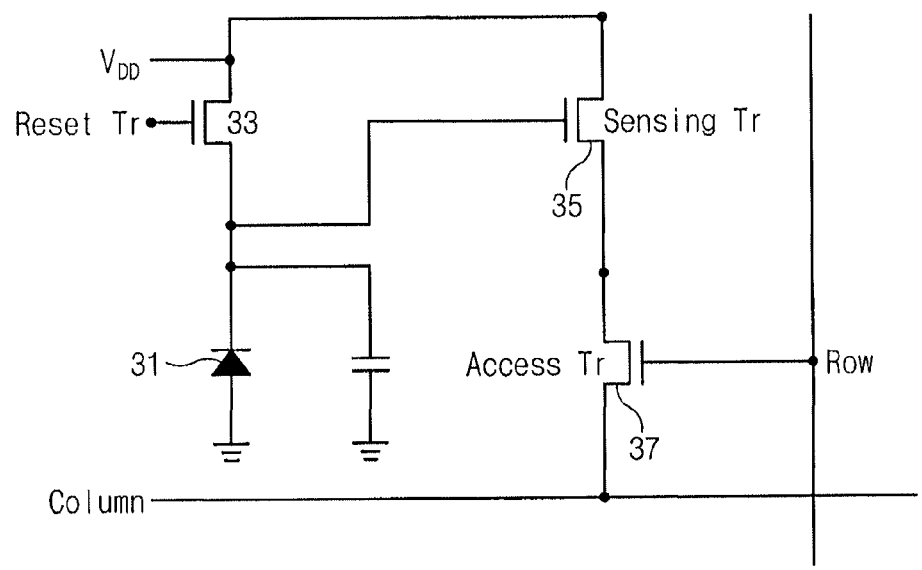
FIG. 3A is an equivalent circuit diagram of a CIS pixel structure having a photo-detective device and three transistors.
Figure 3B:
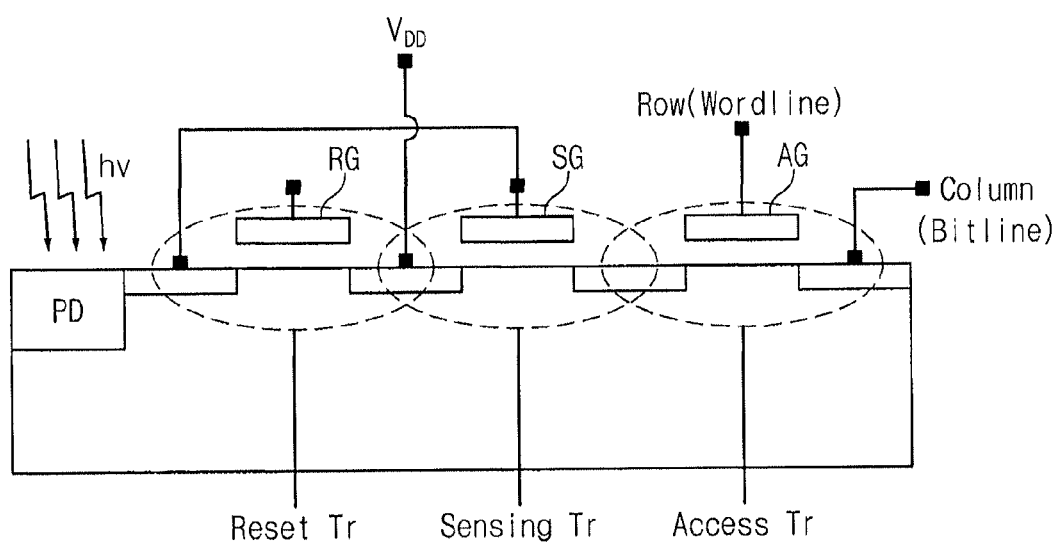
FIG. 3B is a schematic cross-sectional view showing a pixel in a CIS pixel structure having a photo-detective device and three transistors.

FIG. 3A is an equivalent circuit of a CIS pixel structure (hereinafter referred to as three transistor CIS pixel structure) having a photo-detective device and three transistors, and FIG. 3B is a cross-sectional view showing a pixel in a CIS pixel structure having a photo-detective device and three transistors. In order to remove noise due to a parasitic capacitance of the single-transistor CIS pixel structure, the three transistor CIS pixel structure is proposed. According to the three transistor CIS pixel structure, a source follower is inserted into a pixel. It is called a photo diode type APS (Active Pixel Sensor).

Since one pixel is composed of one photo-detective device 31 and three transistors including a reset transistor 33, a sensing transistor 35, and an access transistor 37, the three transistor CIS pixel structure has a fill factor lower than that of the single-transistor CIS pixel structure. Furthermore, a probability of noise occurring becomes high due to non-uniformity of a threshold voltage between pixels of the source follower that is inserted into the pixel for removing noise due to the parasitic capacitance.

Operation of the three transistor CIS pixel structure is as follows. When a reset transistor 33 turns on, a source electrode of the reset transistor 33 has a voltage of $V_{DD}$. As a result, an initialization is achieved, and at this time, a reference value is detected. When external light is incident to a photo diode 31 functioning as a photo-sensing means, a corresponding signal charge EHP is produced. An electric potential of a source electrode of the reset transistor 33 or a gate bias of the sensing transistor 35 changes in proportion to an amount of the produced signal charge EHP. The change in the gate bias of the sensing transistor 35 results in a change of an electric potential of a source electrode of the sensing transistor 35 or a drain electrode of an access transistor 37. At this time, the access transistor 37 is turned on, and data are output to a column side. As the reset transistor 33 is turned on, an electric potential of the source electrode of the reset transistor 33 becomes $V_{DD}$. Such a process is repeatedly performed.

Figure 4A:
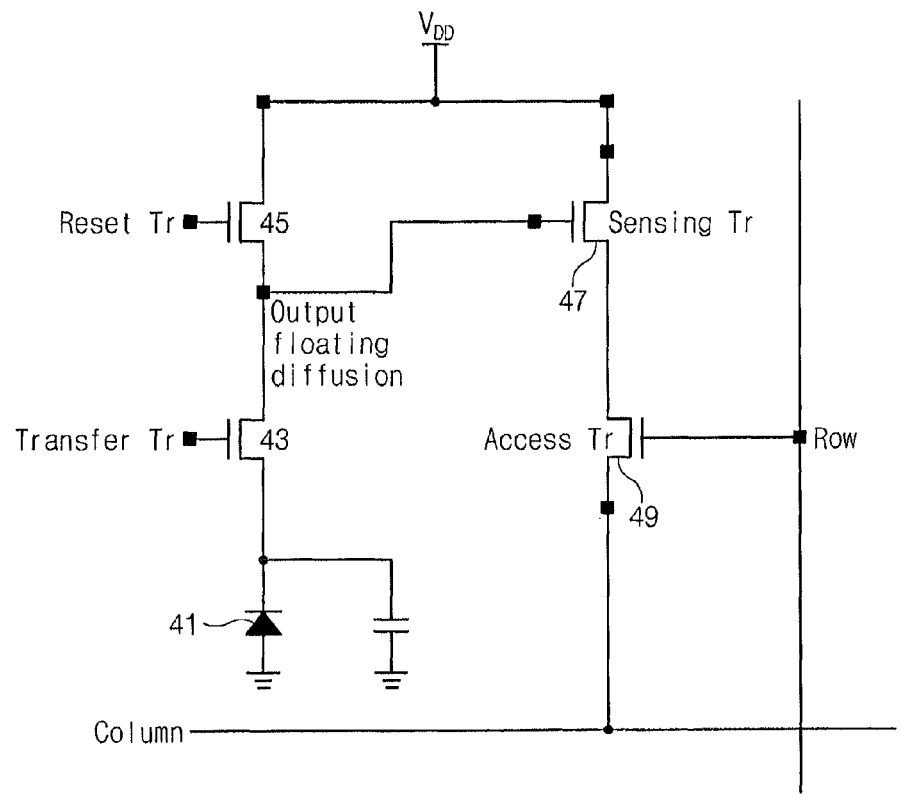
FIG. 4A is an equivalent circuit diagram of a CIS pixel structure having a photo-detective device and four transistors.
Figure 4B:
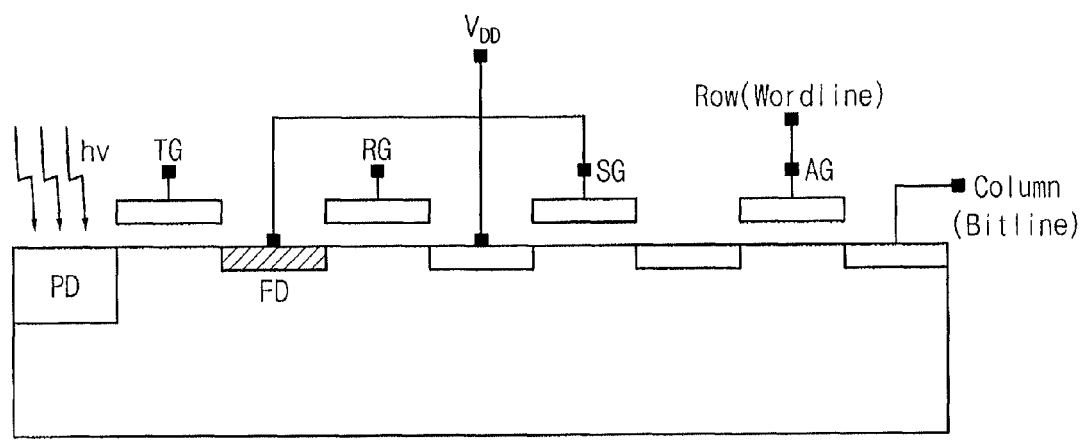
FIG. 4B is a schematic cross-sectional view of a pixel that illustrates an operation of the CIS pixel structure shown in FIG. 4A.

FIG. 4A is an equivalent circuit diagram of a CIS pixel structure (hereinafter referred to as four transistor CIS pixel structure) having a photo-detective device and four transistors. FIG. 4B is a cross-sectional view of a pixel that illustrates an operation of the CIS pixel structure shown in FIG. 4A.

The four transistor CIS pixel structure has a structure similar to that of an output terminal of a CCD. The four transistor CIS pixel structure includes one photo-detective device 41 and four transistors including a transfer transistor 43, a reset transistor 45, a sensing transistor 47, and an access transistor 49. Since the four transistor CIS pixel structure uses a floating diffusion node as an output terminal as in the case of the CCD, a probability of image lagging occurring is high. A probability of noise occurring is high due to non-uniformity of threshold voltages of transistors existing in the pixel as in the case of the three transistor CIS pixel structure. Moreover, since the four transistor CIS pixel structure has more transistors per pixel than other structures, the structure has a disadvantage in that a fill factor is low.

A description will now be given of operation of the four transistor CIS pixel structure. When a reset transistor 45 turns on, an electric potential of an output floating diffusion node 44 becomes $V_{DD}$. At this time, a reference value is detected. When external light is incident to a photo-detective device 31 functioning as a light receiving section, a corresponding signal charge EHP is produced. An electric potential of a source electrode of the transfer transistor 43 changes proportional to an amount of the produced signal charge EHP. When the transfer transistor 43 is turned on, a stored signal charge is transferred to a floating diffusion node, an electric potential of the floating diffusion node and a bias of a gate electrode of the sensing transistor 47 simultaneously changes in proportion to an amount of the transferred signal charge. This causes an electric potential of a source electrode of the sensing transistor 47 to be changed. At this time, the access transistor 49 is turned on, data are output to a column side. As the reset transistor 45 is turned on, an electric potential of the floating diffusion becomes $V_{DD}$. Such an operation is repeatedly performed.

In the above-mentioned CIS pixel structures, MOS transistors are connected to a photo diode functioning as a photo-sensing means. Each gate electrode of the MOS transistors has a structure similar to that of a capacitor of a peripheral circuit region. This assures formation of an impurity diffusion region of the photo diode at a gate electrode of the MOS transistor by a self-alignment method.

That is, the transfer transistor 23 in the single-transistor CIS pixel structure, the reset transistor 33 in the three transistor CIS pixel structure, the transfer transistor 43 in the four transistor CIS pixel structure each has a gate electrode similar to that of a capacitor of the peripheral circuit region.

On the other hand, in a case of the CCD, a transistor outputting a signal charge stored in a photo diode has a gate electrode similar to that of a capacitor of the peripheral circuit region.

Figure 5:
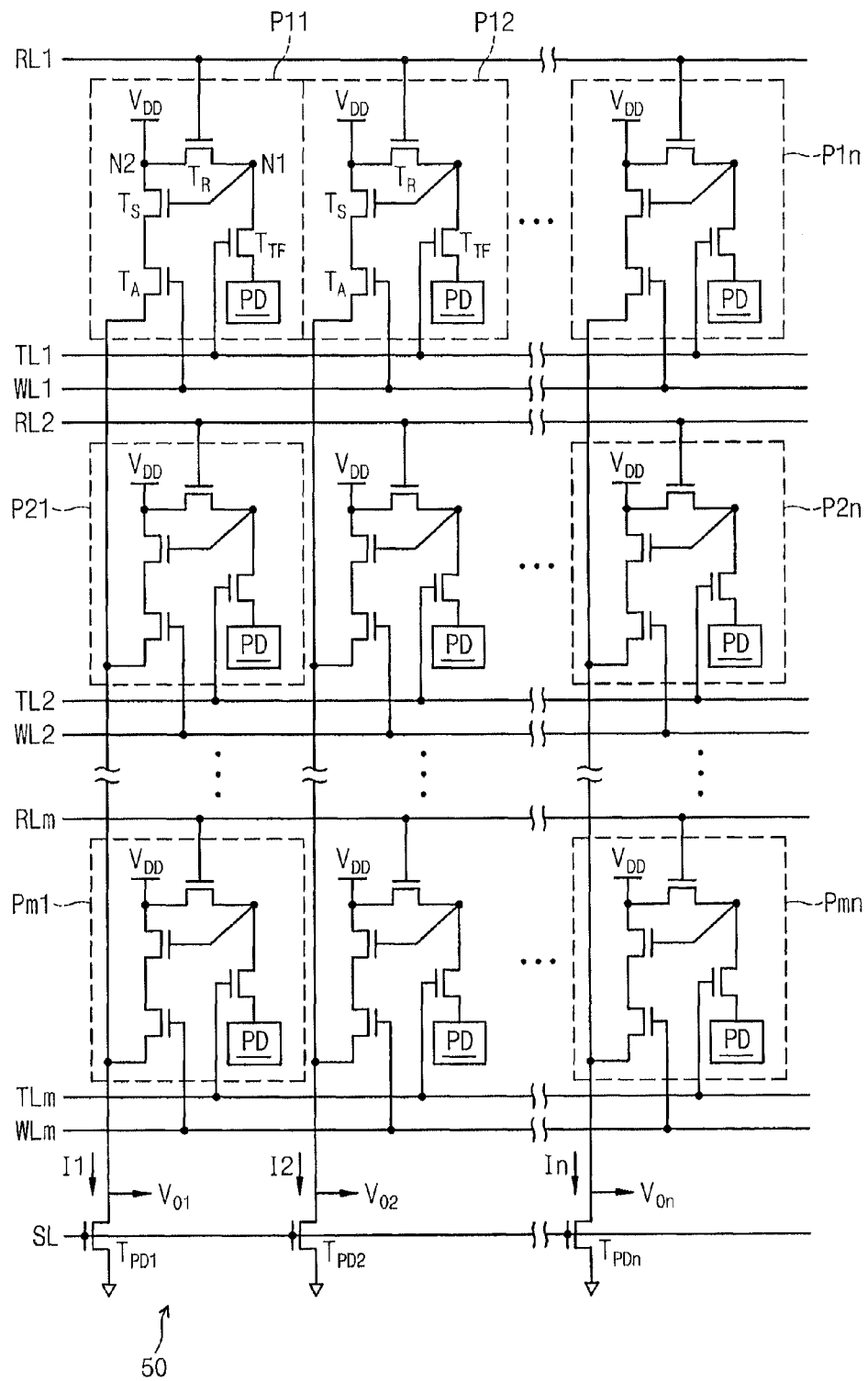
FIG. 5 is an equivalent circuit diagram of a pixel array region of a CIS having four transistors according to an embodiment of the present invention.

FIG. 5 is an equivalent circuit diagram of a pixel array region of a CIS having four transistors according to an embodiment of the present invention. Referring to FIG. 5, a pixel array area 50 includes a plurality of pixels P11, P12, ..., Pm1, ..., and Pmn two-dimensionally arranged in columns and rows. Each of the pixels includes a photo-detective device PD. A photo diode is used as the photo-detective device. The photo diode includes an N-type impurity region and a P-type impurity region. When incident light is irradiated to the photo diode, holes and electrons EHP are produced in the N-type impurity region and the P-type impurity region of the photo diode, respectively.

Each pixel may include a transfer transistor $T_{TF}$, a reset transistor $T_R$, a sensing transistor $T_S$, and an access transistor $T_A$ in addition to the photo-detective device PD. A first node N1 between the sensing transistor $T_S$ and the reset transistor $T_R$ is connected to a gate electrode of the sensing transistor $T_S$. Furthermore, a second node between the reset transistor $T_R$ and the sensing transistor $T_S$ is connected to a power supply $V_{DD}$. When the photo-detective device PD is a photo diode having an N-type impurity region and a P-type impurity region, it is preferred that all of a transfer transistor, a reset transistor, a sensing transistor, and an access transistor are NMOS transistors. In this case, the N-type impurity region of the photo diode is formed in the gate electrode of the transfer transistor by a self-alignment method.

N pixels P11, P12, ..., P1n arranged in a first row are connected to a first reset line RL1, a first transfer line TL1, and a first word line WL1 parallel to the first row. Gate electrodes of transfer transistors $T_{TF}$ in the first row are connected to the first transfer line TL1, and gate electrodes of reset transistors $T_R$ in the first row are connected to the first reset line RL1. In the same manner, N pixels P21, P22, ..., P2n arranged in a second row are connected to a second reset line RL2, a second transfer line TL2, and a second word line WL2 parallel to the second row. N pixels Pm1, Pm2, ..., Pmn arranged in an m-th row are connected to an m-th reset line RLm, an m-th line TLm, and an m-th word line WLm parallel to the an m-th row.

In addition, m pixels P11, P21, ..., Pm1 arranged in a first column are connected to a first pull-down transistor $T_{PD1}$. Source regions of access transistors $T_A$ arranged in the first column are connected to a drain region of the first pull down transistor $T_{PD1}$. Similarly, source regions of access transistors $T_A$ arranged in the second column are connected to a drain region of a second pull down transistor $T_{PD2}$, and source regions of access transistors $T_A$ arranged in an n-th column are connected to a drain region of an n-th pull down transistor $T_{PDn}$. Source regions and gate regions of the pull down transistors $T_{PD1}$, $T_{PD2}$, ..., $T_{PDn}$ are connected to a ground terminal and a selection line SL, respectively.

Hereinafter, a method for outputting data of all pixels in a pixel array area shown in FIG. 5 will be described. With reference to FIG. 5, a voltage corresponding to a high-logic value is applied to a plurality of reset lines RL1, RL2, ..., RLm to turn on all the reset transistors $T_R$. As a result, all charge remaining in the first node N1 is removed and all the pixels are initialized. When all the reset transistors $T_R$ are turned off and an incident light is irradiated to the initialized pixels, charges are produced in the photo-detective devices PD by the incident light. When each of the photo-detective devices PD is a photo diode and each of the transfer transistors $T_{TF}$, the reset transistors $T_R$, the sensing transistors $T_S$, and the access transistors $T_A$ is an NMOS transistor serially connected to an N-type impurity region of the photo diode, electrons are produced in the N-type impurity regions of the photo diodes.

In order to output data of pixels P11, P12, ..., P1n arranged in the first row, a voltage corresponding to a high-logic value is applied to a first transfer line TL1, a first word line WL1, and a selection line SL. Accordingly, in addition to the transfer transistors $T_{TF}$ and the access transistors $T_A$, n pull down transistors $T_{PD1}$, $T_{PD2}$, ..., $T_{PDn}$ are turned on. Consequently, electrons in the N-type impurity region of photo diodes in the first row are transferred to first nodes N1 adjacent thereto. Drivabilities of the sensing transistors $T_S$ are determined according to amount of electrons transferred to the first node N1. As a result, first through n-th currents I1, I2, ..., In flowing through sensing transistors $T_S$ in the first row are provided to a ground terminal through first through n-th pull down transistors $T_{PD1}, T_{PD2}, \ldots, T_{PDn}$. According to magnitudes of the first through n-th currents I1, I2, ..., In, first through n-th output voltages $V_{O1}, V_{O2}, \ldots, V_{On}$ are induced in drain regions of the pull down transistors $T_{PD1}, T_{PD2}, \ldots, T_{PDn}$, respectively. The first through n-th output voltages $V_{O1}, V_{O2}, \ldots, V_{On}$ correspond to data of first through n-th pixels P11, P12, ..., P1n.

In the same way, in order to output data of pixels P21, P22, ..., P2n in the second row, it will be apparent that a voltage corresponding to a high-logic value is applied to a second transfer line TL2, a second word line WL2, and the selection line SL.

Data of all the pixels in a pixel array area 50 are output in the above-described method.

Figure 6:
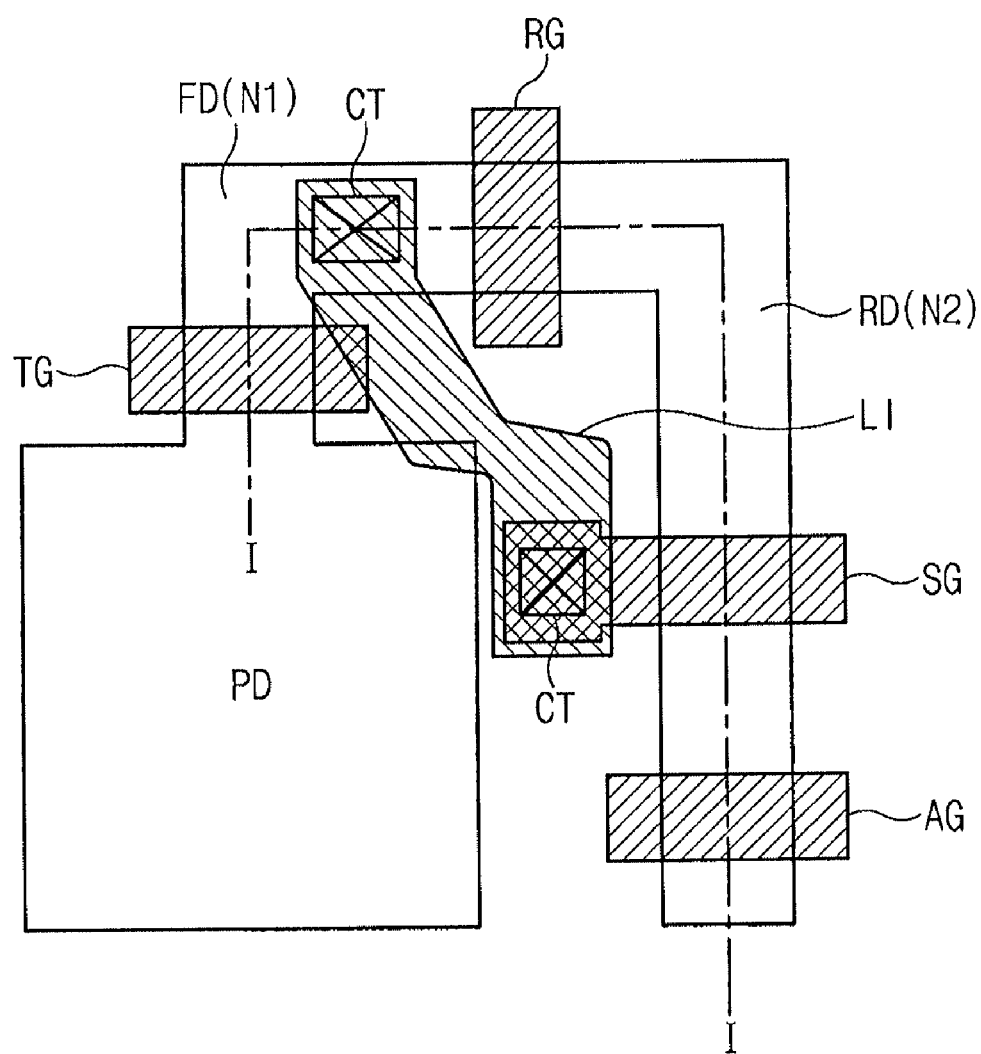
FIG. 6 is a plan view showing a single pixel of the pixel array region shown in FIG. 5.
Figure 7:
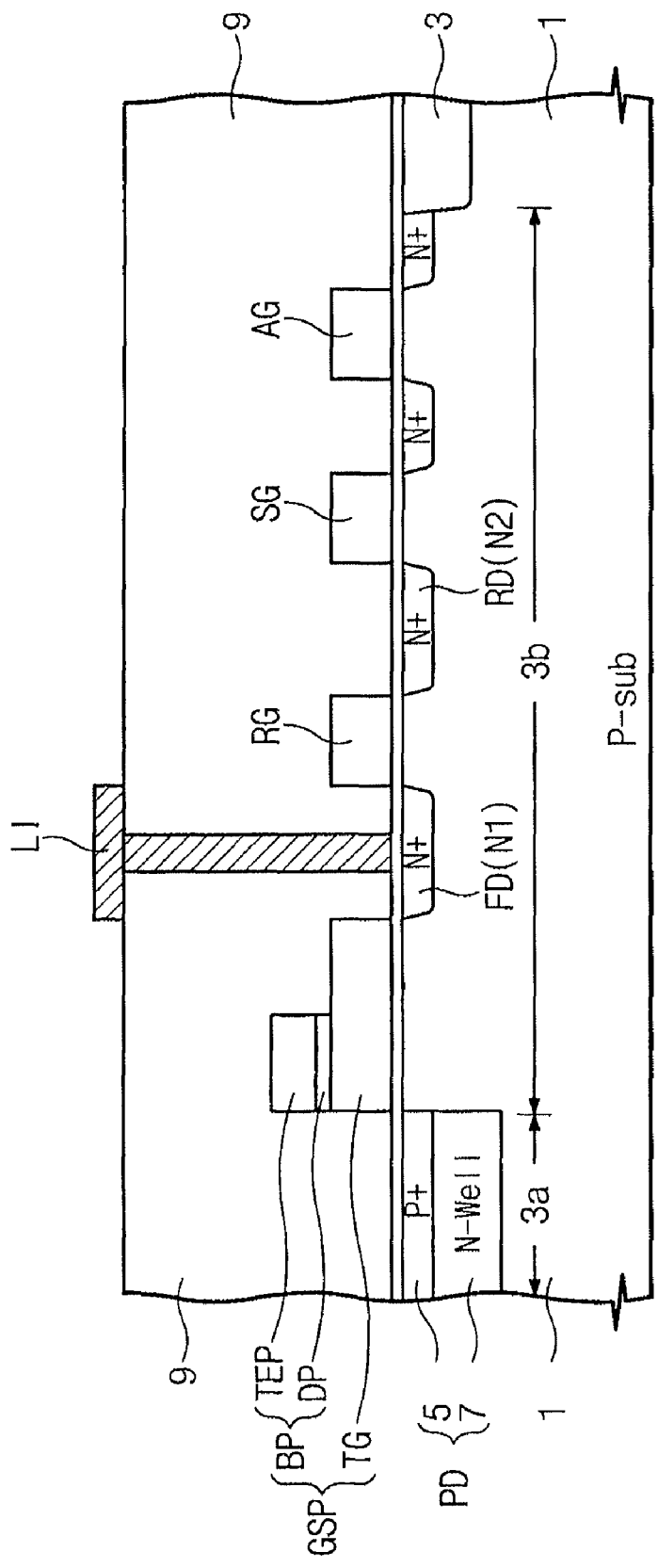
FIG. 7 is a schematic cross-sectional view of a semiconductor substrate in FIG. 6 taken along the line I-I.

FIG. 6 is a plan view showing a single pixel of the pixel array region shown in FIG. 5, and FIG. 7 is a cross-sectional view of a semiconductor substrate in FIG. 6 taken along the line I-I.

Referring to FIGS. 6 and 7, on a predetermined region of a semiconductor substrate 1 of a first conductivity type, for example, a P-type semiconductor substrate, a device isolation layer 3 is disposed to define first and second active regions 3a and 3b in respective pixel regions. The second active region 3b is formed to extend from the first active region 3a. A shape of an active region shown in FIG. 6 or FIG. 7 is only an example. It is not limited to thereto.

A photo-detective device PD such as a photo diode is formed at the first active region 3a. A second conductive impurity diffusion region 7, for example, an N-type well region, is formed at the first active region 3a. An impurity diffusion region of a first conductive type 7, for example, a P-well region, is formed at the first active region 3a. At least one switching element is arranged at the second active region 3b. The at least one switching element includes a transfer transistor $T_{TF}$, a reset transistor $T_R$, a sensing transistor $T_S$, and an access transistor $T_A$ (see FIG. 5) that are formed at the second active region 3b.

The transfer transistor $T_{TF}$ includes a stacked gate electrode GSP that intersects an upper portion of the second active region 3b and is arranged neighboring the first active region 3a. The access transistor $T_A$ also includes an access gate electrode AG that intersects an upper portion of the second active region 3b. The reset transistor $T_R$ includes a reset gate electrode RG that intersects an upper portion of the second active region 3b between the stacked gate electrode GSP and the access gate electrode AG. The sensing transistor $T_S$ includes a sensing gate electrode SG that intersects an upper portion of the second active region 3b between the reset gate electrode RG and the access gate electrode AG.

Gate electrodes of the reset transistor, the sensing transistor, and the access transistor according to the present invention have the same construction and are made of the same material. In contrast to this, the stacked gate electrode GSP of the transfer transistor is different from each gate electrode of the other transistors and is thicker. The stacked gate electrode GSP of the transfer transistor has the same thickness as that of each gate electrode of the other transistors. The stacked gate electrode GSP of the transfer transistor is composed of a transfer gate electrode TG to which a bias voltage is applied and an ion-implantation interrupting pattern BP stacked on the transfer gate electrode TG. The ion-implantation interrupting pattern BP is composed of a dielectric layer pattern DP and an upper electrode pattern TEP. The ion-implantation interrupting pattern BP is smaller than a pattern of the transfer electrode pattern TG. That is, a part of the transfer gate electrode TG is exposed by the ion-implantation interrupting pattern BP and the exposed part of the transfer gate electrode TG is electrically connected to a metal interconnection. Preferably, the exposed part of the transfer gate electrode TG is located opposite to the photo-detective device PD. One side of the transfer gate electrode TG and one side of the ion-implantation interrupting pattern BP are vertically aligned with each other. The other side of the transfer gate electrode TG and the other side of the ion-implantation interrupting pattern BP form a stepped portion.

An N-type well region of a photo diode functions as a source region of the transfer transistor. A second active region 3b between gate electrodes TG, RG, SG, and AG is doped by an N-type impurity. As a result, the transfer transistor, the reset transistor, the sensing transistor, and the access transistor correspond to NMOS transistors.

However, the first conductivity type and the second conductivity type may be an N-type and a P-type, respectively. In this case, a photo diode is composed of a P-well region formed at the first active region 3a and an N-type well impurity region formed on a surface of the P-well region. Consequently, the transfer transistor, the reset transistor, the sensing transistor, and the access transistor correspond to PMOS transistors.

So as to avoid complexity in the embodiment to be illustrated below, only the case where the first conductivity type and the second conductivity type are an N-type and a P-type, respectively, will be given. It will be understood that the reverse of that configuration is within the scope of the invention.

As shown in FIGS. 5 and 6, a floating diffusion region FD (N1 of FIG. 5) corresponds to the second active region 3b between the transfer gate electrode TG and the reset gate electrode RG. Further, a reset diffusion region RD (N2 of FIG. 5) corresponds to the second active region 3b between the reset gate electrode RG and the sensing gate electrode SG, and is connected to a power supply $V_{DD}$.

The semiconductor substrate 1 on which transistors are formed is covered by an interlayer insulation layer 9. The floating diffusion region FD and the sensing gate electrode SG are exposed by a contact hole CT that penetrates the interlayer insulation layer 9. A local wiring L1 is disposed on the interlayer insulation layer 9. The local wiring L1 electrically connects the sensing gate electrode SG to the floating diffusion region FD through the contact hole CT. Although metal interconnections are not shown in the drawings, the metal interconnections are connected to gate electrodes TG, RG, and AG to apply a suitable bias voltage.

A method for foaming an image sensor according to an embodiment of the present invention will now be described with reference to FIGS. 8 to 16. FIGS. 8 through 16 are cross-sectional views that illustrate a method for forming an image sensor according to an embodiment of the present invention. In the embodiment, the description will be given with respect to the case where a CIS in which a p-type semiconductor substrate is used and each pixel includes four transistors and a photo diode as a photo-detective means. It is not limited thereto. It will be apparent to those skilled in the art that the above-mentioned CIS of various structures and a CCD are applicable to the present invention without departing from the scope and spirit of the invention.

In order to simplify the accompanying drawings, only the transfer transistor and the reset transistor are shown, but the sensing transistor and the access transistor are not shown in a pixel array region.

In the drawings, numeral reference "a" represents a pixel array region, numeral reference "b" represents a peripheral circuit region. Active and passive elements such as a MOS transistor, a resistor, a capacitor are formed at the peripheral circuit region. So as to simplify the drawings, only MOS transistors and capacitors are shown.

Figure 8:
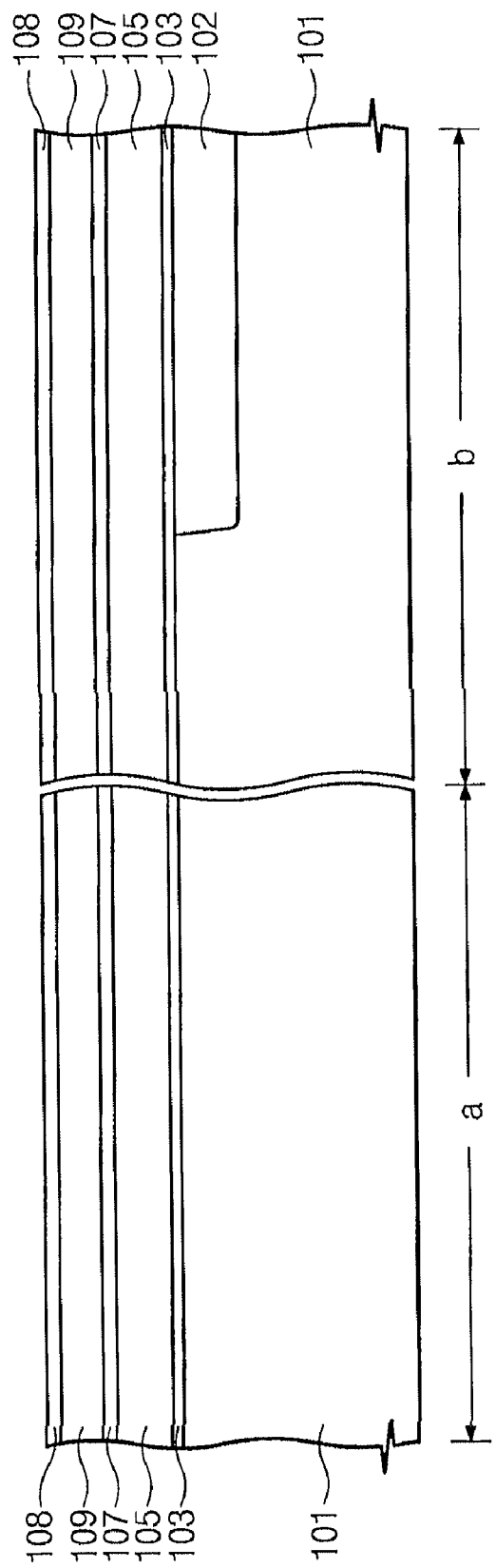
FIGS. 8 through 16 are schematic cross-sectional views of the semiconductor substrate that illustrate a method for forming a CIS according to an embodiment of the present invention.

With reference to FIG. 8, in the method for forming the CIS according to the present invention, a P-type semiconductor substrate 101 is prepared. The semiconductor substrate 101 is prepared by doping a P-type impurity into a single crystalline silicon ingot after cutting it formed by a Czochralski method.

A device isolation process for the semiconductor substrate 101 is performed to form a device isolation layer 102 defining an active region. Shallow trench isolation is used as the device isolation process. Subsequently, a gate oxide layer 103, a first conductive layer 105, a dielectric layer 107, and a second conductive layer 109 are sequentially formed. The gate oxide layer 103 is formed, for example, by a thermal oxidation.

The first conductive layer 105 is used as a gate electrode of a transistor that defines each pixel in the pixel array region "a". The first conductive layer 105 of the peripheral circuit region "b" is used as a gate electrode of a transistor or a lower electrode of a capacitor. For example, the first conductive layer 105 is formed by polysilicon.

The dielectric layer 107 is used as a dielectric layer of a capacitor that is formed at the peripheral circuit region "b". The dielectric layer 107 is formed by a layer having a high dielectric constant, for example, such as multiple layers formed by sequentially stacking oxide layer-nitride layer-oxide layer.

The second conductive layer 109 is used as an upper electrode of a capacitor that is formed at the peripheral circuit region "b". The second conductive layer 109 is also used as a transistor in the vicinity of a photo-detective device in the pixel array region "a". That is, in this embodiment, the second conductive layer 109 remains on a transfer gate electrode of a transfer transistor and functions as an ion-implantation interrupting pattern. The second conductive layer 109 is comprised of polysilicon. A passivation layer 108 is formed on the second conductive layer 109. The passivation layer 108 prevents the second conductive layer 109 from being etched in a next process of patterning the first conductive layer 105. For example, the passivation layer 108 is formed by a material having an etching selectivity ratio for the first conductive layer 105, such as silicon nitride or tungsten.

Figure 9:
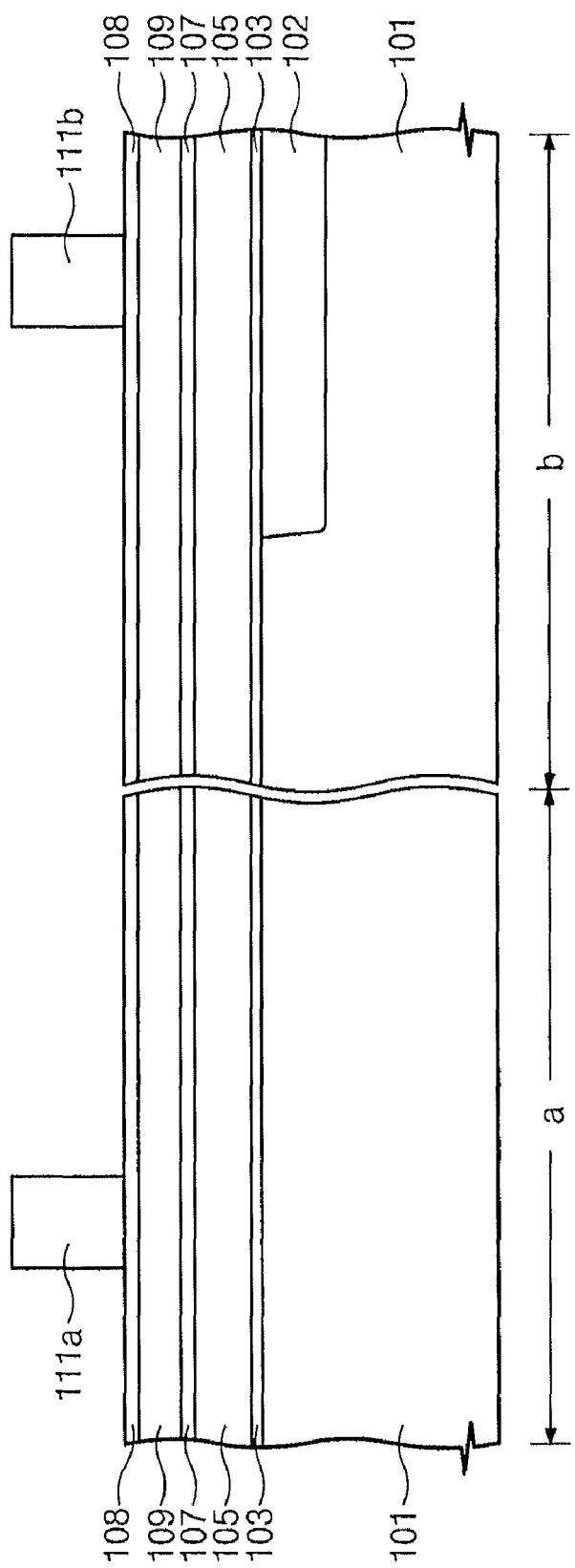

Referring to FIG. 9, first etch mask patterns 111a and 111b are formed on the passivation layer 108. The first etch mask pattern 111a on the pixel array region "a" functions as the ion-implantation interrupting pattern, and the first etch mask pattern 111b on the peripheral circuit region "b" functions as the upper electrode of the capacitor. The first etch mask patterns 111a and 111b can be formed by a known photolithography process.

Figure 10:
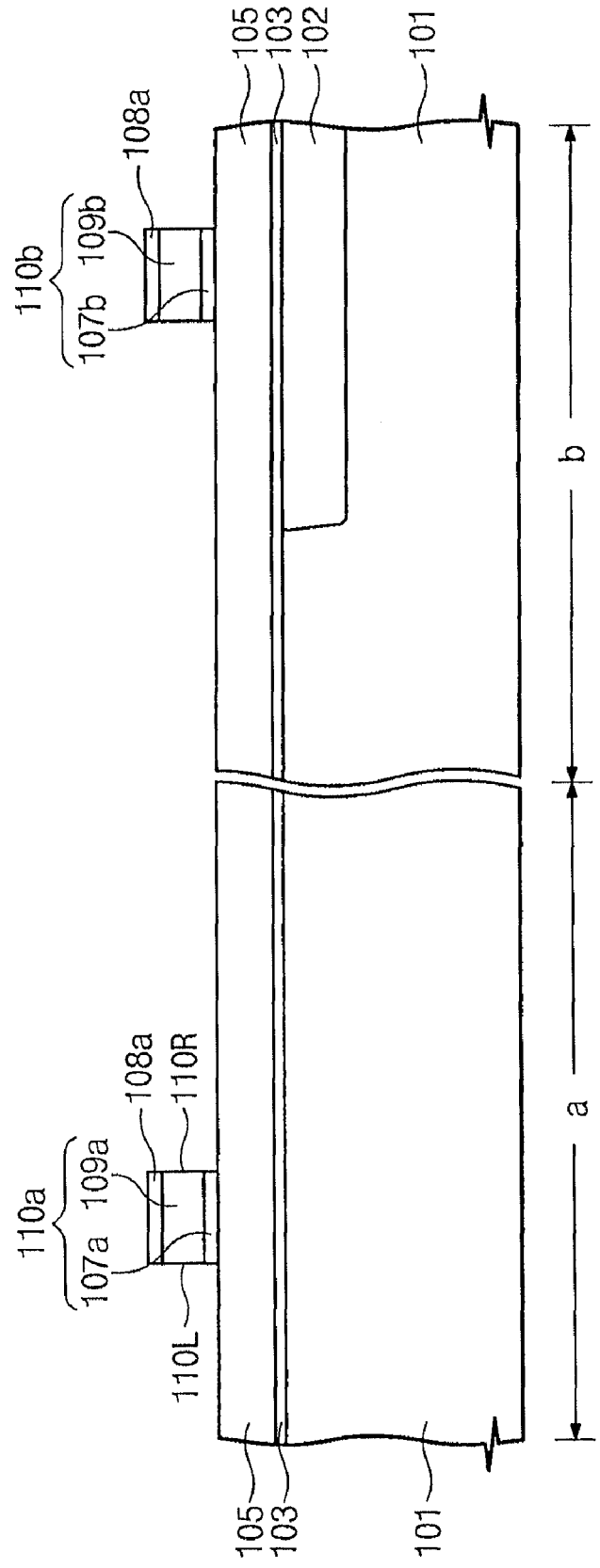

Referring to FIG. 10, the passivation layer, the second conductive layer, and the dielectric layer exposed by the first etch mask patterns 111a and 111b are removed until the first conductive layer 105 is exposed, causing the formation of the ion-implantation interrupting pattern 110a composed of a dielectric layer pattern 107a and a second conductive layer pattern 109a at the pixel array region "a", and an upper electrode pattern 109b and a dielectric layer pattern 107b at the peripheral circuit region "b". An upper portion of the ion-implantation interrupting pattern 110a is covered by a passivation layer pattern 108a. The ion-implantation interrupting pattern 110a includes two sides 110L and 110R. One side 110L of the ion-implantation interrupting pattern 110a is formed in the vicinity of the photo-detective device PD, the other side 110R thereof is formed opposite to the photo-detective device PD.

Figure 11:
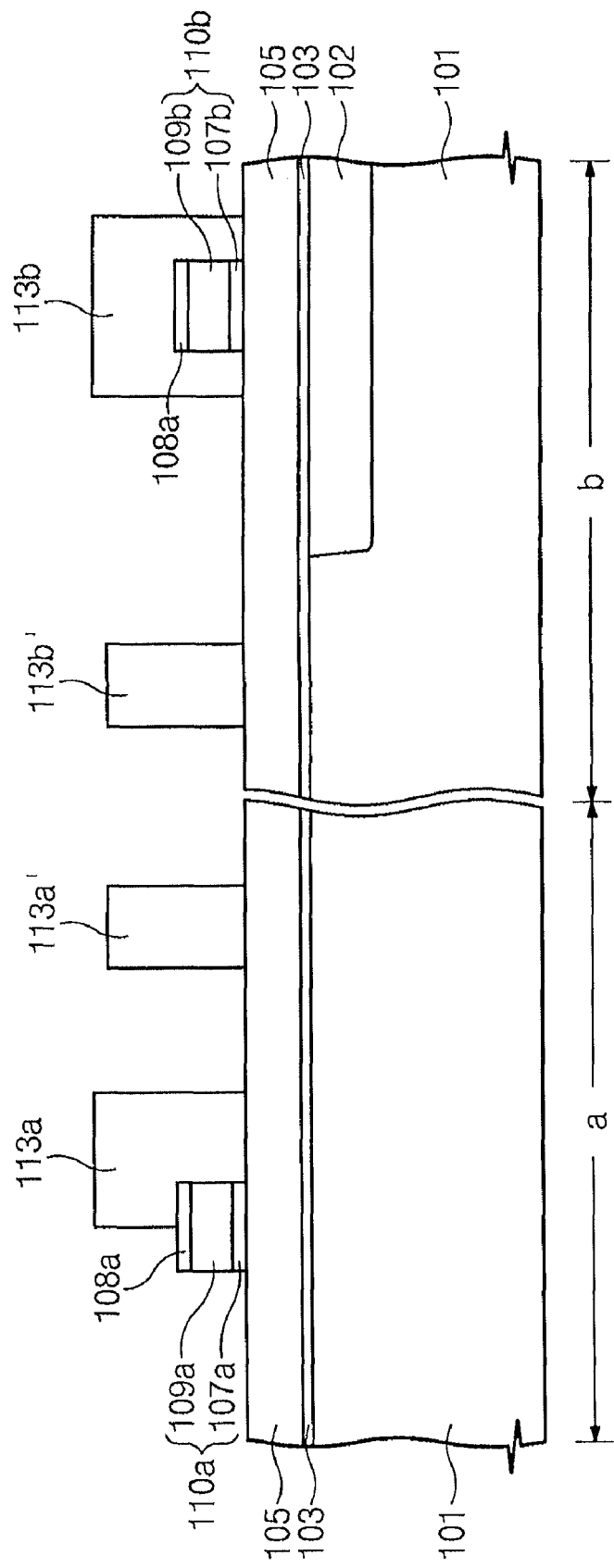

After the first etch mask patterns 111a and 111b are removed by a following process, a process for forming gate electrodes of all the transistors and the lower electrode of the capacitor are performed. Referring to FIG. 11, second etch mask patterns 113a, 113a', 113b, and 113b' are formed. The second etch mask patterns 113a, 113a', and 113b' define a gate electrode of a transistor. The second etch mask pattern 113b defines a lower electrode of a capacitor. In detail, the second etch mask pattern 113a defines a transfer gate of a transfer transistor, and covers a part of the ion-implantation interrupting pattern 110a. Namely, the second etch mask pattern 113a exposes the one side 110L of the ion-implantation interrupting pattern 110a, and covers a part of the first conductive layer outside the other side 110R of the ion-implantation interrupting pattern 110a. The second etch mask patterns 113a' and 113b' define a gate electrode of a reset transistor and a gate electrode of a transistor in a peripheral circuit region "b", respectively. The second etch mask pattern 113b defines a lower electrode of a capacitor, and covers an upper electrode pattern and a part of the first conductive layer outside the upper electrode pattern. The second etch mask patterns 113a, 113a', 113b, and 113b' are formed by the same manner as the case in the first etch mask patterns.

Figure 12:
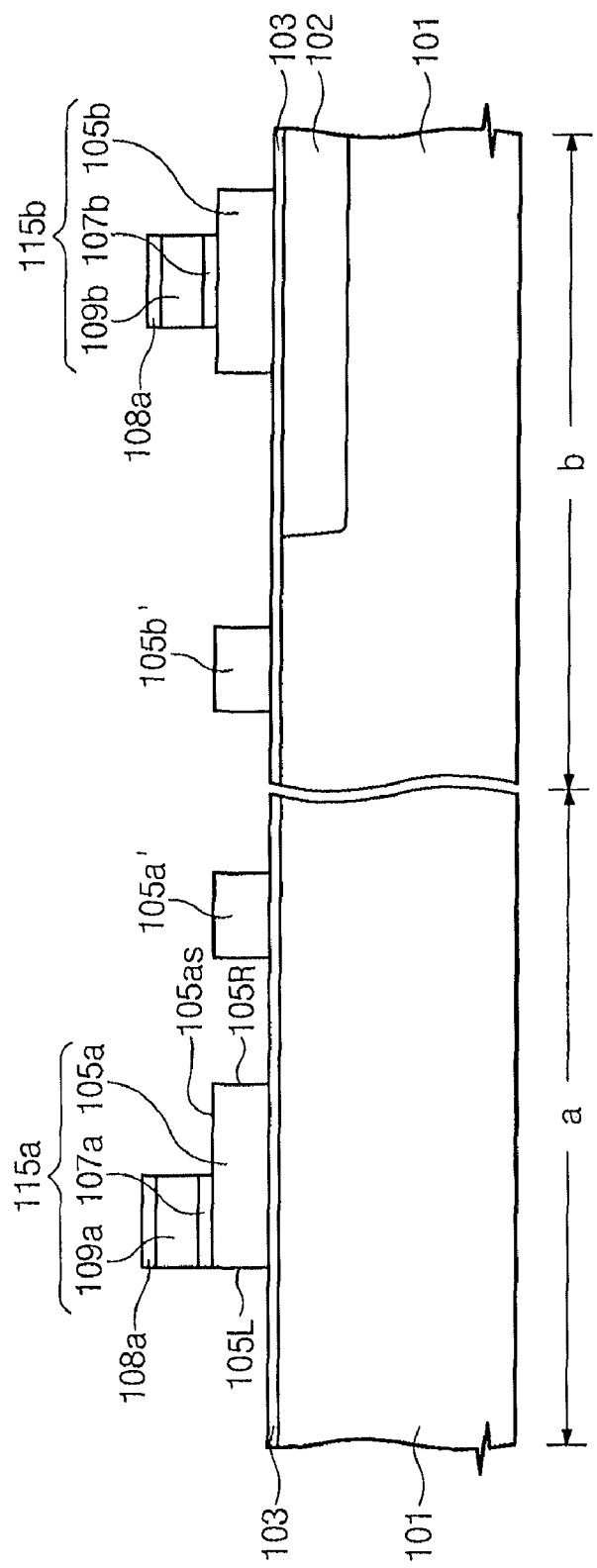

Referring to FIG. 12, a first conductive exposed layer is etched by using the second etch mask patterns 113a, 113a', 113b, and 113b' and the passivation layer pattern 108a as an etch mask to form gate electrodes 105a, 105a' and 105b', and a lower electrode pattern 105b. Accordingly, a transfer transistor in the pixel array region "a" includes a stacked gate electrode 115a on which a transfer gate 105a and the ion-implantation interrupting pattern 110a are stacked. A capacitor 115b is composed of a lower electrode pattern 105b, a dielectric layer pattern 107b, and an upper electrode pattern 109b of the peripheral circuit region "b".

One side 105L of the transfer gate electrode 105a is vertically aligned with one side 110L of the ion-implantation interrupting pattern 110a, whereas the other side 105R of the transfer gate electrode 105a is not vertically aligned with the other side 110R of the ion-implantation interrupting pattern 110a. A size of the ion-implantation interrupting pattern 110a is smaller than that of the transfer gate electrode 105a. The ion-implantation interrupting pattern 110a covers a part of the transfer gate electrode 105a and exposes another part 105as thereof. A metal interconnection is electrically connected to the exposed part 105as of the transfer transistor to apply a bias voltage thereto.

Figure 1:
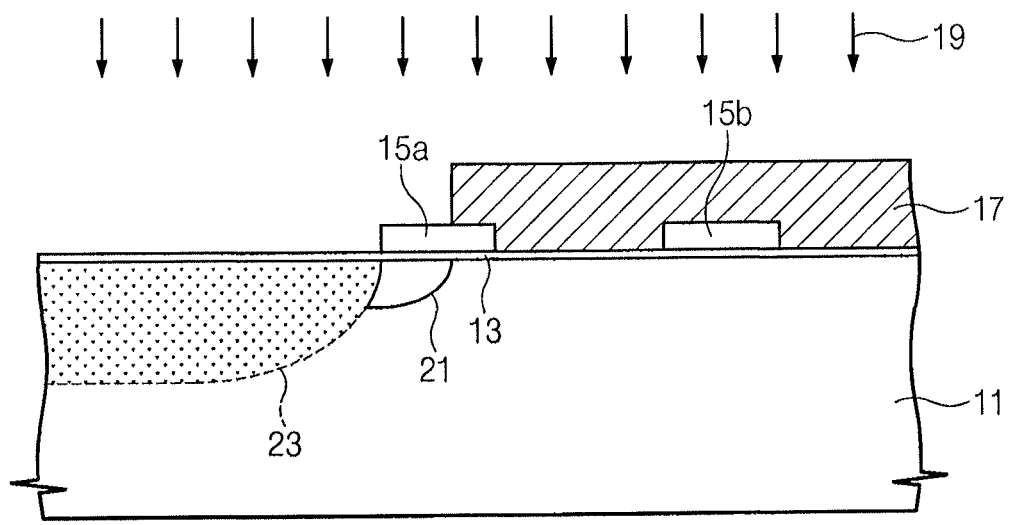
FIG. 1 is a cross-sectional view showing a pixel of a pixel array region that illustrates an impurity ion implantation for a photo diode in a manufacturing process of a CIS.
Figure 13:
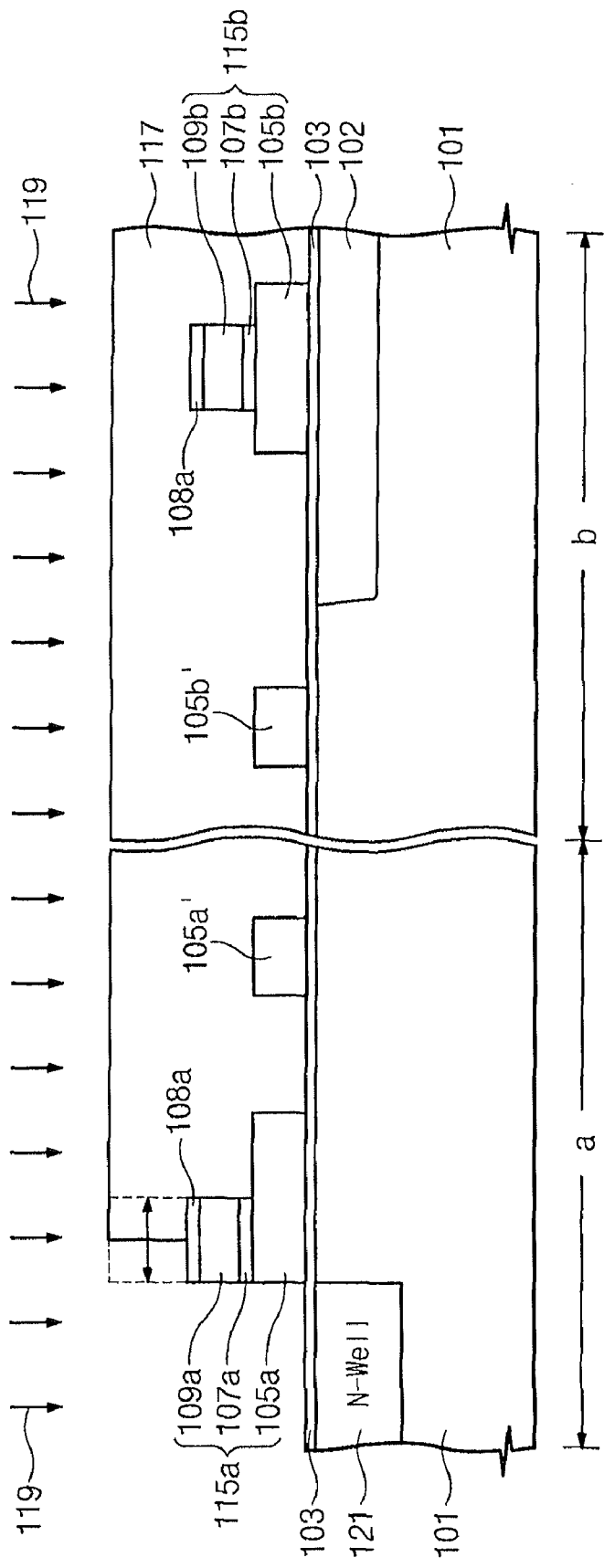
Figure 14:
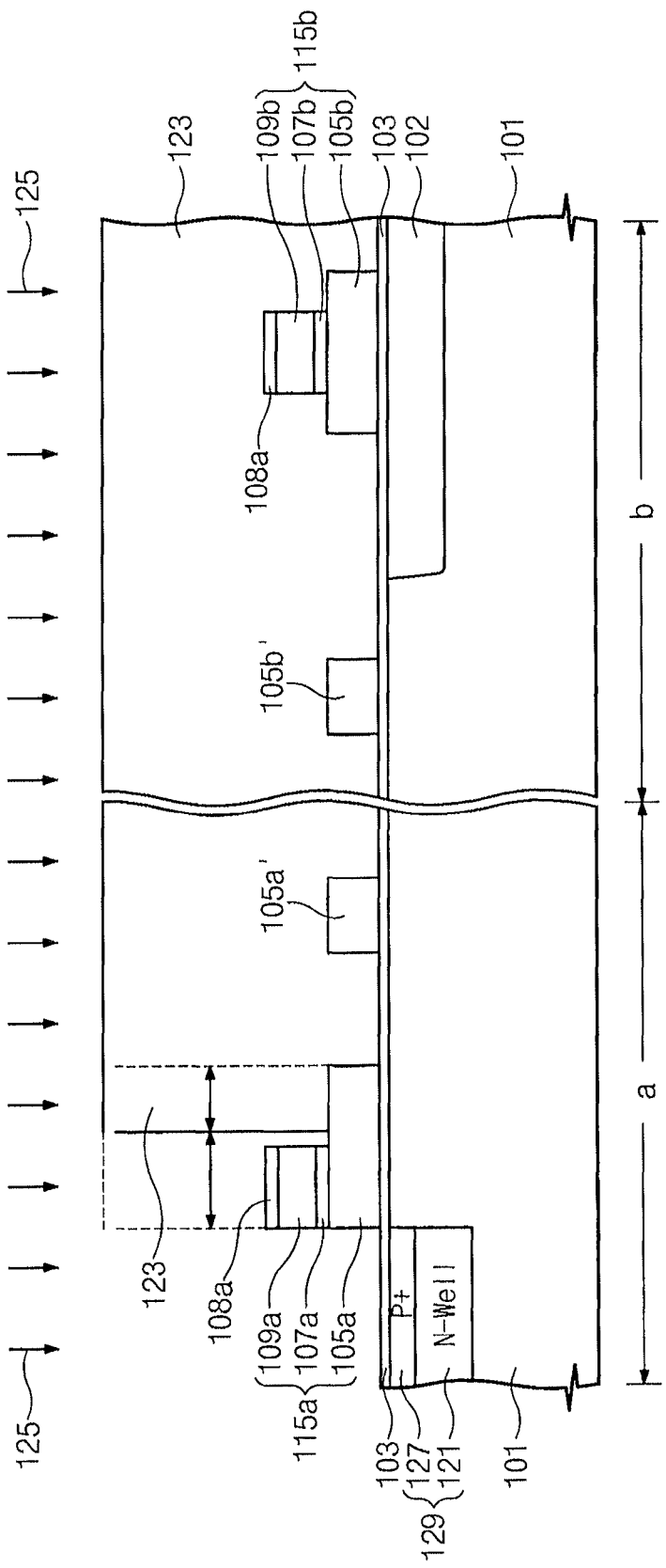

Next, an ion implantation process for forming a photo-detective device is performed and will now be described with reference to FIGS. 13 and 14. With reference to FIG. 13, a first ion implantation mask 117 is formed to expose a region 3a (see FIGS. 6 and 7) on which a photo-detective device in the pixel array region "a" will be formed. The first ion implantation mask 117 may be formed by a known photolithography process. The first ion implantation mask 117 covers other parts of the semiconductor substrate other than the region 3a on which a photo-detective device in the pixel array region "a" will be formed. According to the present invention, the first ion implantation mask pattern 117 can be formed to expose a part of the ion-implantation interrupting pattern 110a. An extent to which the first ion implantation mask pattern 117 exposes the ion-implantation interrupting pattern 110a can be varied according to processes. This means that a misalignment margin of a photolithography process for the formation of the first ion implantation mask pattern 117 is great. However, as shown in FIG. 1, when the ion-implantation interrupting pattern is absent, an ion implantation mask should not expose the transfer transistor. Although the ion implantation mask exposes the transfer transistor, it should expose the transfer transistor by the same extent in every process.

After the first ion implantation mask pattern 117 is formed and an N-type impurity ion is implanted into the first ion implantation mask pattern 117 for forming a photo diode, an N-type well region 121 is formed at the semiconductor substrate 101 in the pixel array region "a" by performing a thermal oxidation. The N-type well region 121 is formed at the one side 105L of the transfer gate electrode 105a in the transfer transistor by a self-alignment method.

After the second ion implantation mask pattern 123 is formed and a P-type impurity ion is implanted into the second ion implantation mask pattern 123 for forming a photo diode, a P-type impurity diffusion region 127 is formed in the N-type well region 121 by performing a heat treatment. Accordingly, a photo diode 129 is formed, and the second ion implantation mask pattern 123 is formed to expose the N-type well region 121.

Figure 15:
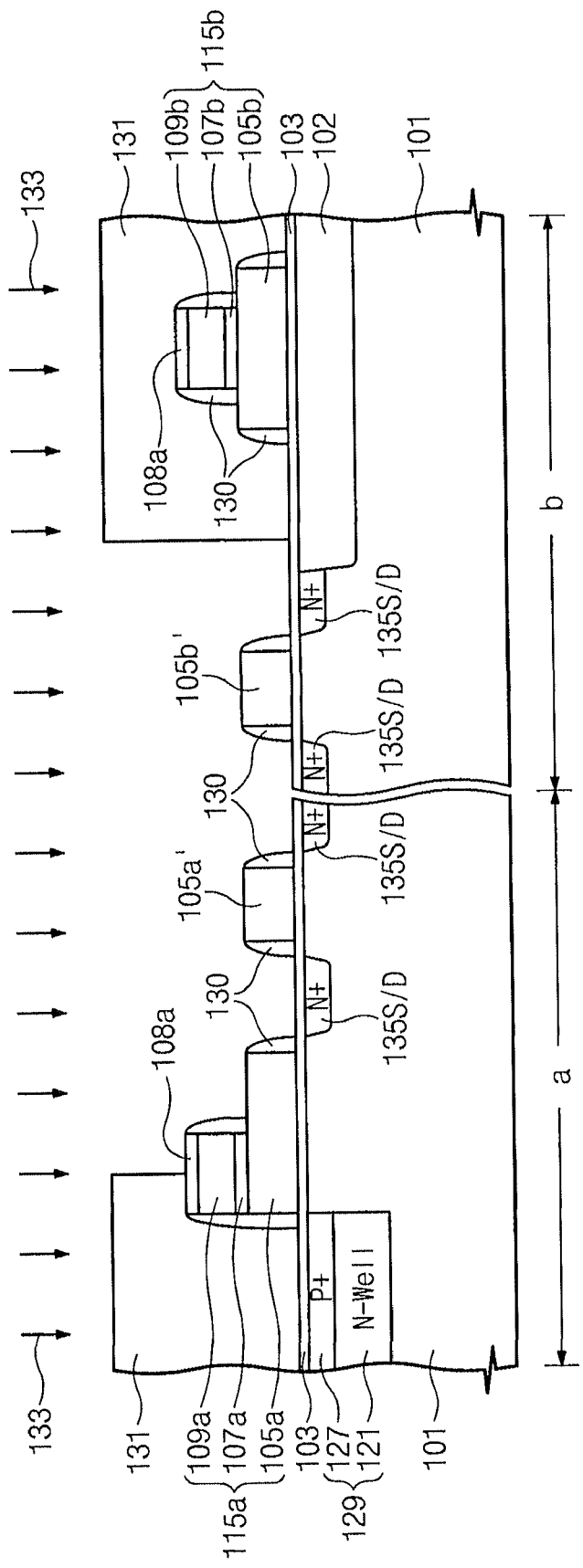

An ion implantation process for forming a source/drain of a transistor is performed as a next process. With reference to FIG. 15, after spacers 130 are formed at sides of the gate electrode 105a, and a photo diode 129 and a second ion implantation mask covering a capacitor 115b are formed, N-type impurity diffusion regions 135S/D at a semiconductor substrate between gate electrodes are formed by a heat treatment. Each of the N-type impurity diffusion regions 135S/D is formed shallower than the N-type well region. The spacer 130 is formed by a material having an etching selectivity ratio for an interlayer insulation layer 137 (see FIG. 16) to be formed by a following process, such as silicon nitride layer.

The N-type impurity diffusion regions 135S/D between the transfer gate electrode 105a and the reset gate electrode 105b function as a floating diffusion region. Signal charges formed in the photo diode 129 are temporarily stored in the N-type impurity diffusion regions 135S/D.

Figure 16:
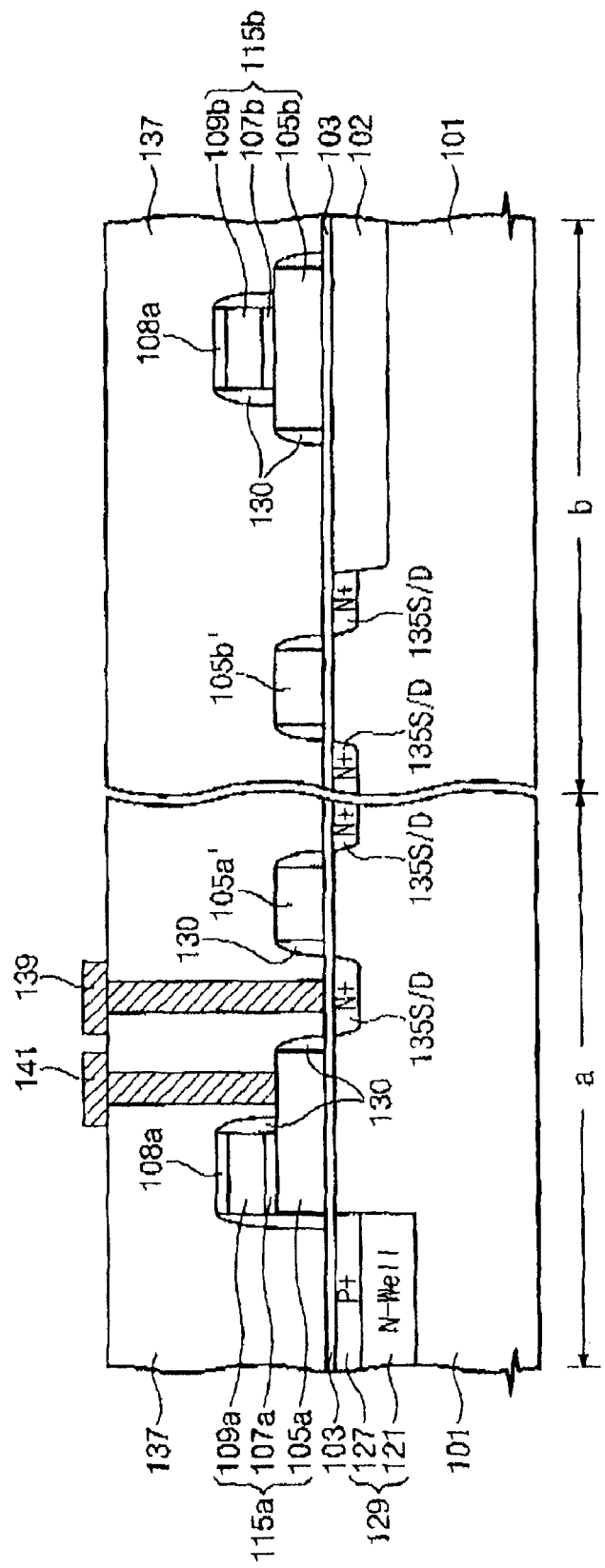

Subsequently, a mutual connection and wiring process for applying a suitable bias voltage to all gate electrode and source/drain regions is performed. Referring to FIG. 16, after removing a second ion implantation mask pattern 131, an interlayer insulation layer 137 is formed. For example, the interlayer insulation layer is composed of an insulation oxide layer. After a contact hole is formed by patterning the interlayer insulation layer 137, a conductive layer is formed and patterned to form metal interconnections for applying a suitable bias voltage to all the gate electrodes and the source/drain regions. The metal interconnections are not shown in drawings.

With reference to FIG. 16, a metal interconnection 139 for connecting a floating diffusion region FD between a transfer gate electrode and a reset gate electrode to a gate electrode of a sensing transistor is formed.

Metal interconnections electrically connected to the gate electrodes are formed. A transfer line (141, TL of FIG. 5) is formed to be electrically connected to an exposed region 105a of the transfer gate electrode. A reset line (RL of FIG. 5) is formed to be electrically connected to a gate electrode of the reset transistor. A word line (WL of FIG. 5) is formed to be electrically connected to a gate electrode of an access transistor.

In the method for forming the CIS having a four transistor structure according to the present invention mentioned above, sizes of transfer gate electrode 105a and the ion-implantation interrupting pattern 110a are different from each other, but the same sizes thereof can be used according to processes. In this case, in a process for forming a transfer line connected to the transfer gate electrode, a contact hole is formed to simultaneously penetrate the ion-implantation interrupting pattern as well as an interlayer insulation layer. After the contact hole is formed, a sidewall spacer can be fanned at an inner wall of the contact hole as needed.

A reset transistor, a sensing transistor, and an access transistor can be formed to have the same structure as that of the transfer transistor. In this case, in a process for forming metal lines RL, TL, and WL connected to gate electrodes of the transistors, a contact hole is formed to simultaneously penetrate an ion-implantation interrupting pattern as well as an interlayer insulation layer.

When the above-described method is applied to a CIS of a three transistor structure, as mentioned above, a gate electrode of the reset transistor 33 (see FIG. 3) is indicative of a stacked gate pattern composed of a gate electrode and an ion-implantation interrupting pattern.

When the above-described method is applied to a CCD, as described above, a gate electrode of a transistor for outputting a charge stored in a photo-detective device to a floating diffusion region indicates a stacked gate pattern.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

According to the preferred embodiment of the present invention, since an ion-implantation interrupting pattern is disposed on a gate electrode of a transfer transistor in the vicinity of a photo diode, a well region of the photo diode is formed at one side of a transfer gate electrode by a self-alignment method. Therefore, the present invention can stably form a threshold voltage of the transfer transistor.

What is claimed is:

1. A method of forming an image sensor, comprising:
   (i) sequentially forming a gate oxide layer, a first conductive layer, a dielectric layer, and a second conductive layer on a semiconductor substrate;
   (ii) patterning the second conductive layer and the dielectric layer to form an ion-implantation interrupting pattern having sides;
   (iii) patterning the first conductive layer to form a gate electrode pattern having sides and being larger than the ion-implantation interrupting pattern so that one side of the ion-implantation interrupting pattern and one side of the gate electrode pattern are vertically aligned with each other;
   (iv) forming a first impurity diffusion region at the semiconductor substrate aligned with one side of the ion-implantation interrupting pattern and one side of the gate electrode pattern;
   (v) forming an impurity diffusion region of a first conductivity type in the first impurity diffusion region, the first impurity diffusion region being of a second conductivity type; and
   (vi) forming a second impurity diffusion region of the second conductivity type at the semiconductor substrate aligned with the other side of the gate electrode pattern.

2. The method as set forth in claim 1, further comprising; forming an interlayer insulation layer; and
   forming a metal interconnection electrically connected to an upper side of the gate electrode pattern exposed to another side of the ion-implantation interrupting pattern through the interlayer insulation layer.

3. The method as set forth in claim 1, wherein step (ii) comprises:
  (ii-1) forming a passivation layer on the second conductive layer;
  (ii-2) forming a first etch mask pattern on the passivation layer;
  (ii-3) etching the passivation layer, the second conductive layer, and the dielectric layer formed at an outer side of the first etch mask pattern until the first conductive layer is exposed; and
  (ii-4) removing the first etch mask pattern.

4. The method as set forth in claim 3, wherein patterning the first conductive layer comprises:
  (iii-1) forming a second etch mask pattern to cover a part of an upper surface of the ion-implantation interrupting pattern and a part of the second conductive layer at another outer side of the ion implantation pattern;
  (iii-2) etching the second conductive layer using the second etch mask pattern and the passivation layer as etch masks; and
  (iii-3) removing the second etch mask pattern.

5. The method as set forth in claim 4, wherein forming a first impurity region comprises:
  (iv-1) forming a first ion implantation mask to cover at least the gate electrode pattern;
  (iv-2) implanting impurity ions of the second conductivity type into the semiconductor substrate in the vicinity of one side of the gate electrode pattern using the first ion implantation mask; and
  (iv-3) removing the first ion implantation mask.

6. The method as set forth in claim 4, wherein forming an impurity diffusion region of a first conductivity type in the first impurity region comprises:
  (v-1) forming a second ion implantation mask to expose the first impurity diffusion region of the second conductivity type;
  (v-2) implanting impurity ions of the first conductivity type into the first impurity diffusion region of the second conductivity type using the second ion implantation mask;
  (v-3) removing the second ion implantation mask.

7. The method as set forth in claim 4, wherein forming a second impurity diffusion region comprises:
  (vi-1) forming a third ion implantation mask to cover at least the first impurity diffusion region of the second conductivity type and the impurity diffusion region of the first conductivity type;
  (vi-2) implanting impurity ions of the second conductivity type into the semiconductor substrate in the vicinity of another side of the gate electrode pattern using the third ion implantation mask; and
  (vi-3) removing the third ion implantation mask.

8. The method as set forth in claim 4, wherein an upper electrode pattern and a dielectric pattern are formed spaced from the ion-implantation interrupting pattern by a predetermined distance when the ion-implantation interrupting pattern having sides is formed by patterning the second conductive layer and the dielectric layer, and
  a lower aligned electrode pattern is formed under the upper electrode pattern and the dielectric pattern when the gate electrode pattern having sides are formed by patterning the first conductive layer.

9. The method as set forth in claim 8, wherein a plurality of gate electrode patterns are formed spaced from the gate electrode pattern and the lower electrode pattern by a predetermined distance when the gate electrode pattern is formed by patterning the first conductive layer, and a third impurity diffusion region of the second conductivity type are formed at the semiconductor substrate between the plurality of gate electrode patterns during the formation of the second impurity diffusion region of the second conductivity type.

10. The method as set forth in claim 4, wherein the first impurity diffusion region of the second conductivity type is formed deeper than the second impurity diffusion region of the second conductivity type.

11. A method for forming an image sensor, comprising:
  (a) sequentially forming a gate oxide layer, a first conductive layer, a dielectric layer, and a second conductive layer on a semiconductor substrate having defined pixel array and peripheral circuit regions;
  (b) patterning the second conductive layer and the dielectric layer to form an ion-implantation interrupting pattern of a second conductive layer pattern and a dielectric layer pattern at the pixel array region, and to form an upper electrode pattern and a dielectric pattern on the peripheral circuit region;
  (c) patterning the first conductive layer to form a gate electrode pattern under the ion-implantation interrupting pattern at the pixel array region and to form a lower electrode pattern larger than the upper electrode pattern at the peripheral circuit region so that one side of the ion-implantation interrupting pattern and one side of the gate electrode pattern are vertically aligned with each other;
  (d) forming a first impurity diffusion region at the semiconductor substrate aligned with sides of the ion-implantation interrupting pattern and the gate electrode pattern;
  (e) forming an impurity diffusion region of a first conductivity type in the first impurity diffusion region, the first impurity diffusion region being of a second conductivity type; and
  (f) forming a second impurity diffusion region of the second conductivity type at the semiconductor substrate aligned with another side of the gate electrode pattern.

12. The method as set forth in claim 11, wherein a plurality of first gate electrode patterns and a plurality of second gate electrode patterns are further formed at the pixel array region and the peripheral circuit region, respectively, when the gate electrode pattern having sides is formed at the pixel array region, and the lower electrode pattern is formed at the peripheral circuit region by patterning the first conductive layer.

13. The method as set forth in claim 12, further comprising;
  forming an interlayer insulation layer; and
  forming a metal interconnection electrically connected to an upper surface of the gate electrode pattern exposed to another side of the ion-implantation interrupting pattern through the interlayer insulation layer.

14. The method as set forth in claim 11, wherein patterning the second conductive layer and the dielectric layer comprises:
  (b-1) forming a passivation layer on the second conductive layer;
  (b-2) forming a first etch mask pattern on the passivation layer;
  (b-3) etching the passivation layer, the second conductive layer, and the dielectric layer formed at an outer side of the first etch mask pattern until the first conductive layer is exposed; and
  (b-4) removing the first etch mask pattern.

15. The method as set forth in claim 11, wherein patterning the first conductive layer comprises:
- (c-1) forming a second etch mask which covers a part of the upper electrode pattern and a part of a first conductive layer formed at an outer side of the upper electrode pattern, covers a second conductive layer formed at another outer side of the ion-implantation interrupting pattern, and exposes a part of an upper surface of the ion-implantation interrupting pattern; and
- (c-2) etching a first conductive layer using the second etch mask pattern, the ion-implantation interrupting pattern, and the passivation layer as etch masks.

16. The method as set forth in claim 11, wherein forming a first impurity diffusion region comprises:
- (d-1) forming a first ion implantation mask to expose a semiconductor substrate in the vicinity of one side of the gate electrode pattern;
- (d-2) implanting impurity ions of the second conductive type into the semiconductor substrate in the vicinity of the one side of the gate electrode pattern by using the first ion implantation mask; and
- (d-3) removing the first ion implantation mask.

17. The method as set forth in claim 11, wherein forming an impurity diffusion region of a first conductivity type in the first impurity diffusion region comprises:
- (e-1) forming a second ion implantation mask to expose the first impurity diffusion region of the second conductivity type;
- (e-2) implanting impurity ions of the first conductivity type into the first impurity diffusion region of the second conductivity type using the second ion implantation mask; and
- (e-3) removing the second ion implantation mask.

18. The method as set forth in claim 11, wherein forming a second impurity diffusion region comprises:
- (f-1) forming a second ion implantation mask to cover the first impurity diffusion region of the second conductivity type and the impurity diffusion region of the first conductivity type;
- (f-2) implanting impurity ions of the second conductivity type into the semiconductor substrate in the vicinity of another side of the gate electrode pattern and a semiconductor substrate between the plurality of first and second gate electrode patterns by using the second ion implantation mask, the gate electrode pattern, and the plurality of first and second gate electrode patterns as ion implantation masks; and
- (f-3) removing the second ion implantation mask.

* * * * *